United States Patent [19]
Nakamura

[11] Patent Number: 5,374,201
[45] Date of Patent: Dec. 20, 1994

[54] SOCKET FOR ELECTRIC PART

[75] Inventor: Ryuichi Nakamura, Kawasaki, Japan

[73] Assignee: Yamaichi Electronics Co., Ltd., Tokyo, Japan

[21] Appl. No.: 229,435

[22] Filed: Apr. 12, 1994

Related U.S. Application Data

[63] Continuation of Ser. No. 999,145, Dec. 31, 1992, abandoned.

[30] Foreign Application Priority Data

Mar. 10, 1992 [JP] Japan .................................. 4-087641

[51] Int. Cl.⁵ .............................................. H01R 11/22
[52] U.S. Cl. .................................... 439/266; 439/331
[58] Field of Search ............... 439/266, 264, 267, 269, 439/330, 331, 68, 70, 73

[56] References Cited

U.S. PATENT DOCUMENTS

| | | | |
|---|---|---|---|
| 4,789,345 | 12/1988 | Carter | 439/266 |
| 4,993,955 | 2/1991 | Savant | 439/331 |
| 5,186,641 | 2/1993 | Uratsuji | 439/331 |

FOREIGN PATENT DOCUMENTS 4-154065  5/1992  Japan .

Primary Examiner—Larry I. Schwartz
Assistant Examiner—Hien D. Vu
Attorney, Agent, or Firm—Wenderoth, Lind & Ponack

[57] ABSTRACT

A socket for an electric part having a body; a plurality of contacts arranged in an array on the body and adapted to be contacted with contact pieces on the electric part when the electric part is inserted into the socket the contacts each having a contacting portion adapted to engage in pressure contact with a corresponding contact piece, a spring portion for exerting a contact pressure on the contacting portion, and a hook-shaped retaining portion and an operating member having an acting portion over which the hook-shaped retaining portions are hooked in sliding engagement with the acting portion and movably mounted on the socket body for moving the retaining portions to cause the contacting portions to be shifted away from the contact pieces of the electric part against the resilient force of the spring portions, the acting portion having retaining element damping walls thereon spaced along the acting portion at intervals greater than the thickness of the retaining portions of the contacts and separating and guiding the retaining portions of adjacent contacts during movement of the acting portion.

2 Claims, 5 Drawing Sheets

SOCKET FOR ELECTRIC PART

This application is a continuation of now abandoned application Ser. No. 07/999,145, filed Dec. 31, 1992, now abandoned.

BACKGROUND OF THE INVENTION

1. Field of the Invention

This invention relates to a socket for an electric part, provided with means for shifting contacts between a contact position and a release position.

2. Prior Art

The invention of Japanese Patent Application No. Hei 2-278461 published unexamined application No. Hei 4-154065, discloses a socket including a turnable lever engageable with contacts arranged in an array. In this socket, the contacts can be shifted, as a group, away from contact pieces arranged on an electric part by properly turning the turnable lever, in order to facilitate no-load-insertion of the electric part.

As shown in FIG. 8, however, the above conventional socket has the following problems. When the contacts 2 are repeatedly shifted by turning the lever 1 repeatedly, the contacts 2 are horizontally displaced along their engagement surfaces with respect to the lever 1, and contacting portions of the contacts are likewise displaced. As a result, reliable contact relation with terminals of an inserted electric part is adversely affected. Moreover, if the amount of side displacement is significant, it gives rise to another problem of short-circuit between adjacent contacts 2.

SUMMARY OF THE INVENTION

It is therefore an object of the present invention to provide a socket for an electric part, in which contacts can be shifted between a contact position and a release position in a reliable manner.

According to the present invention, there is provided, in order to achieve the above object, a socket for an electric part, having a plurality of contacts arranged, in an array, on a body of the socket and adapted to be contacted with contacting pieces on the electric part, the contacts each including a contacting portion adapted to engage in pressure contact with a corresponding one of the contact pieces and a spring portion adapted to exert a contact pressure on the contacting portion, wherein the socket body is provided with an operating member adapted to engage with engagement elements of the contacts so as to cause contacting portions thereof to be shifted away from the electric part against elastic force of the spring portion of the contacting portions, the operating member being provided with retaining element damping walls capable of being inserted between adjacent retaining elements.

DETAILED DESCRIPTION OF THE EMBODIMENT

One embodiment of the present invention will be described in detail with reference to FIGS. 1 through 7.

Figure 1:
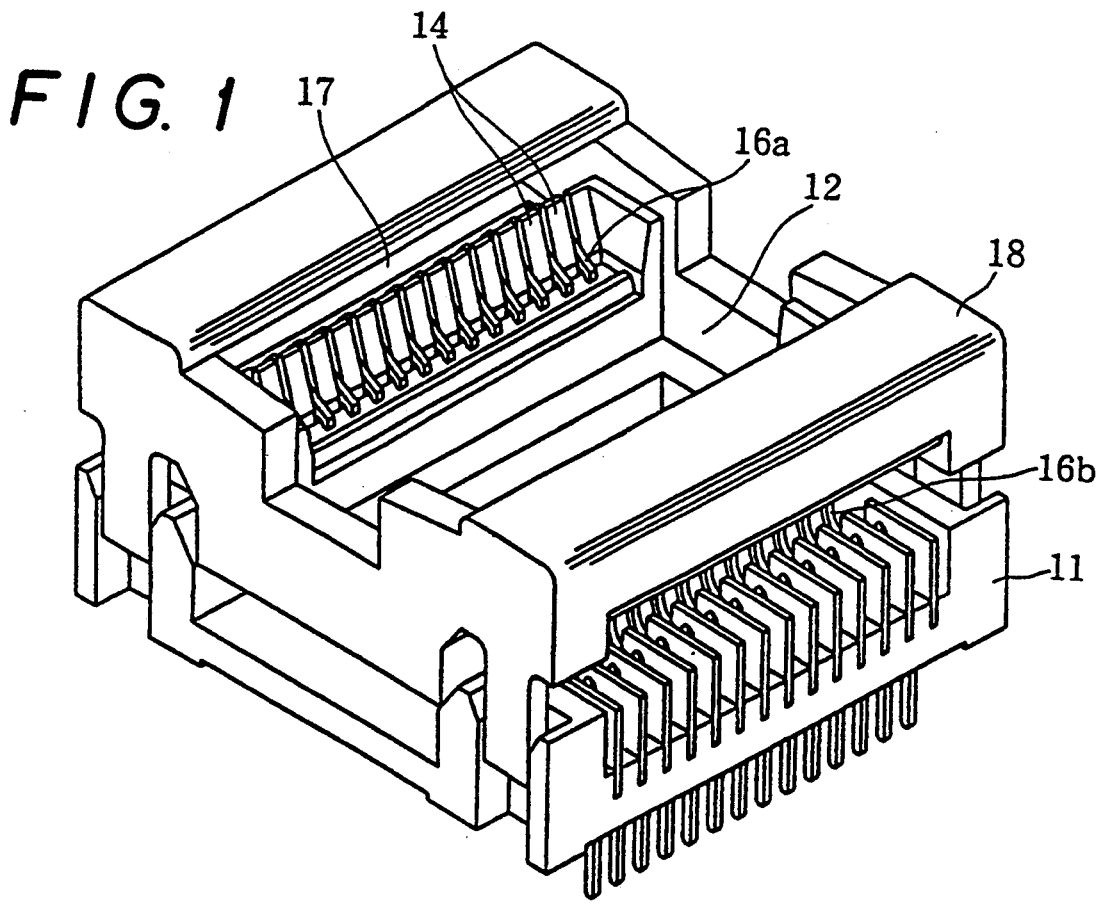
FIG. 1 is a perspective view of a socket for an electric part according to one embodiment of the present invention.
Figure 2:
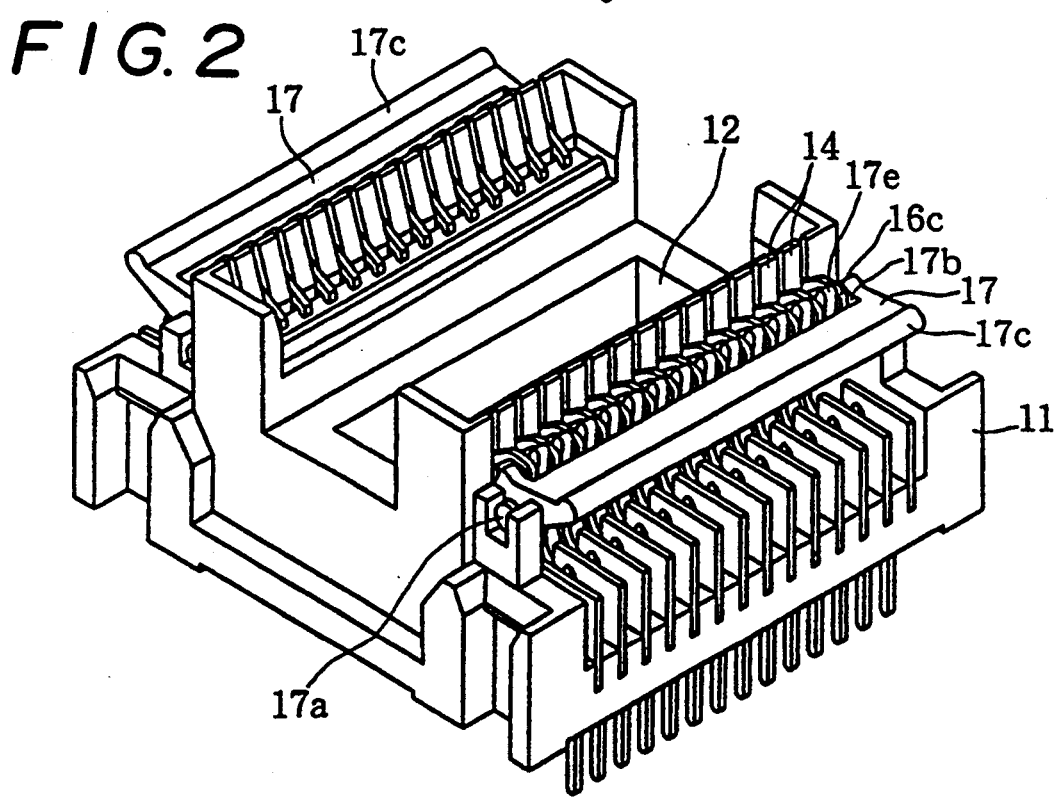
FIG. 2 is a perspective view of the socket of FIG. 1 from which a cover member has been removed, i.e. a socket having no cover member.
Figure 3:
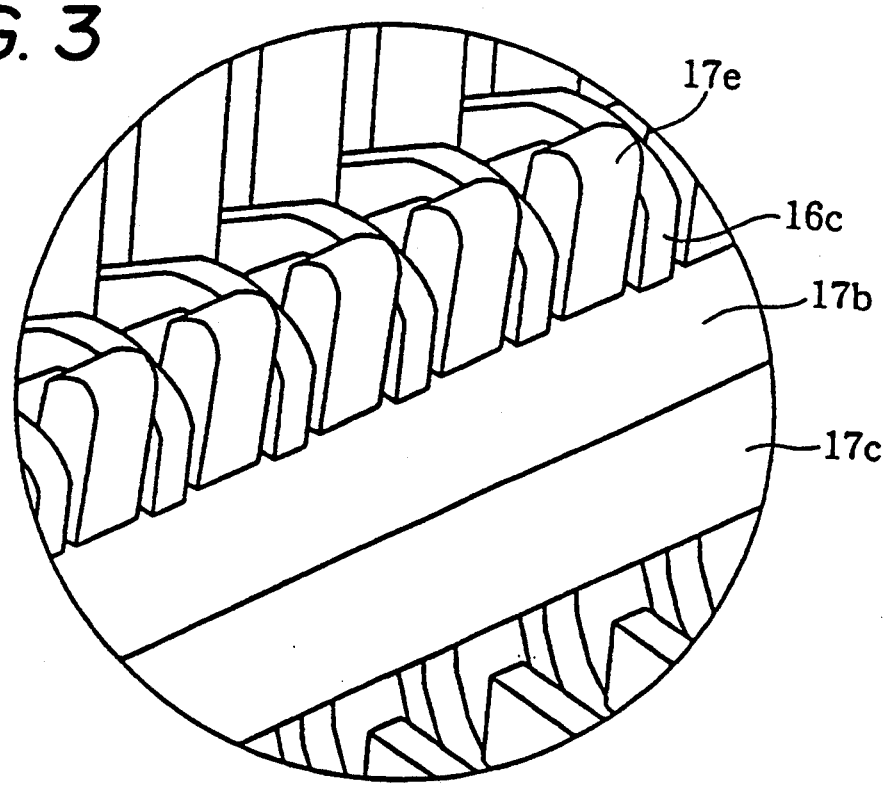
FIG. 3 is an enlarged perspective of a part of the socket particularly show an engagement area between retaining elements of contacts and an operating member.

As is apparent from FIGS. 1, 2, etc., a socket for an electric part has an electric part accommodation portion 12 opening to an upper surface of a base member 11 which is formed of an electric insulating material. The socket also has a lead support seat 15 located at an inner bottom of the accommodation portion 12, the lead support seat 15 adapted to support a number of leads 13a projecting sideward from two sides or four sides of an electric part represented by an IC 13. The socket further has a number of contacts 16 arranged in an array along two sides or four sides of the accommodation portion 12.

Figure 4A:
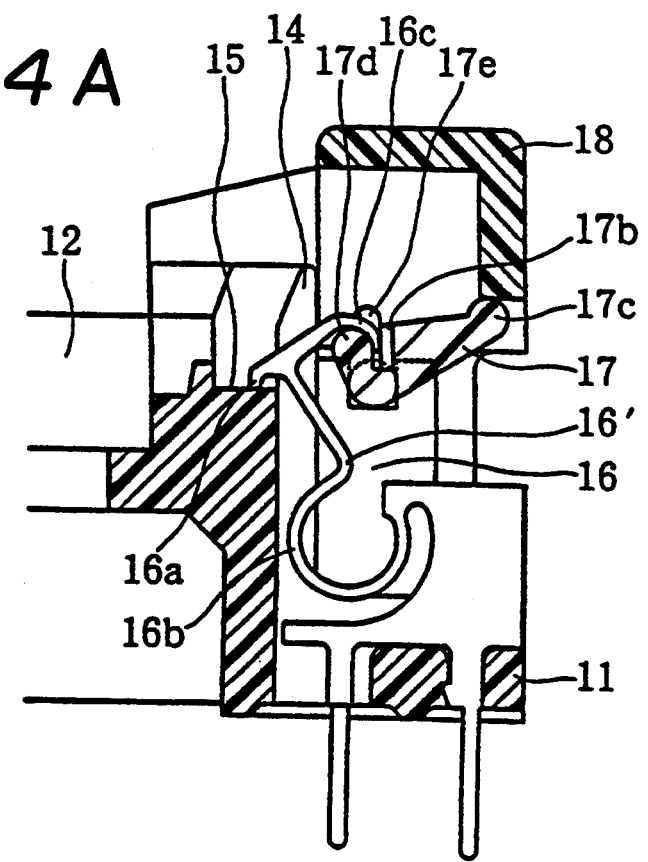
FIGS. 4A through 4C are sectional views for explaining the sequence of action of the operating member and shifting states of the contacts (only one contact is shown)

Each contact 16 includes a support base portion 16' having a spring portion 16b, and a contacting portion 16a formed on an upper end of the support base portion 16' and projecting inwardly therefrom. The contacting portion 16a is supported by the support base portion 16' such that the former is held in a position over the lead support seat 15. As shown in FIG. 4A, when the IC 13 is not accommodated in the accommodation portion 12, in other words, when the leads 13a are not supported on the support seat 15, the support base portion 16' is shifted forwardly and inwardly together with the contacting portion 16a by elastic force of the spring portion 16b, in order to cause the contacting portion 16a to be abutted against an upper surface of the lead support seat 15, thereby allowing the spring portion 16b to store a predetermined amount of elastic force.

Figure 4B:
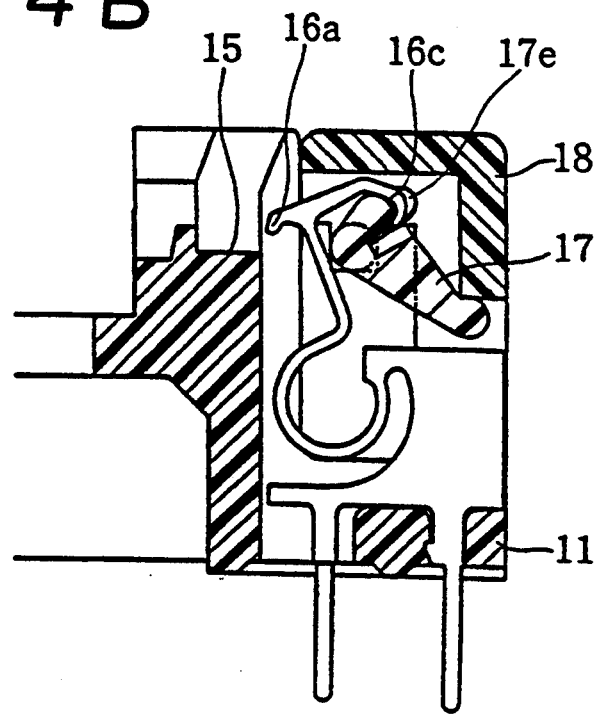
Figure 4C:
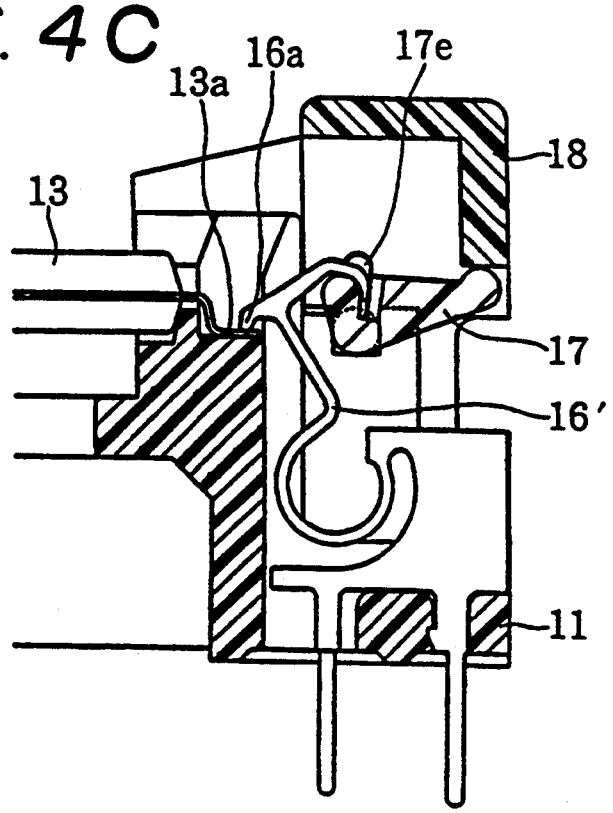
Figure 5:
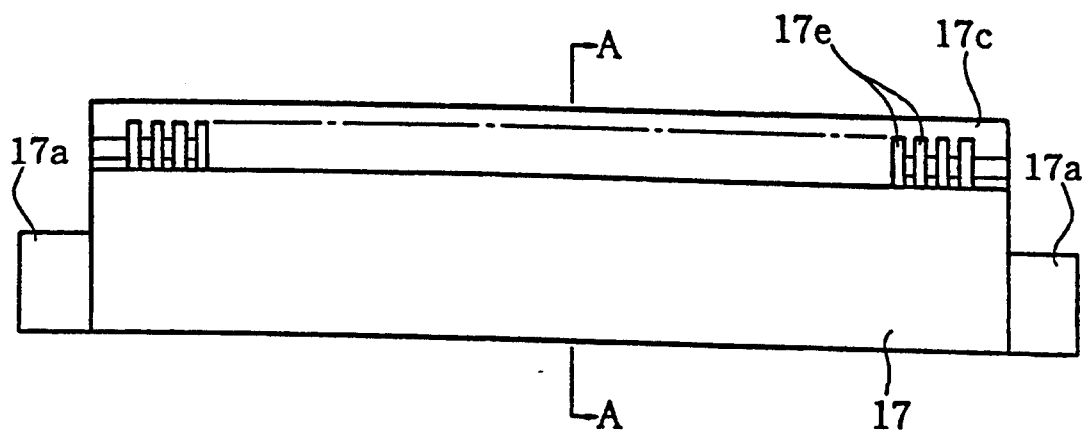
FIG. 5 is a front view of the operating member.

As shown in FIG. 4B, when the support base portion 16' is shifted backwardly and outwardly against the elastic force of the spring portion 16b, the contacting portion 16a is moved upwardly and laterally to a position where it will not interfere with the lead support seat 15 and the leads 13a to be supported on the seat 15. With contacting portions 16a in that state, the IC 13 is inserted into the accommodation portion 12 under no-load, and the leads 13a are supported on the support seat 15. Furthermore, as shown in FIG. 4C, after the insertion of the IC into the accommodation portion 12, the support base 16' of the contact 16 is shifted inwardly by the restoring force of the spring-portion 16b, so that the contacting portion 16a is moved in pressure contact with the upper surface of the lead 13a.

The socket of the present invention comprises an operating member 17 formed of an electrically insulating portion serving as means for shifting each contact 16 backwardly, and a cover member 18 likewise formed of an electrically insulating material serving as means for actuating the operating member 17. This operating member 17 is a means for applying backward tensile force to the contacts 16. The operating member 17 is constituted by a turnable member or a reciprocating member.

FIGS. 2, 4, etc. respectively illustrate an embodiment in which the operating member 17 comprises a turnable lever. As shown, the turnable lever serving as the operating member 17 is horizontally positioned behind the support base portions 16' of the contacts 16 along the row of the contacts 16. This operating member 17 is disposed in the vicinity of an upper end of the support base portion 16' (i.e., in the vicinity of the contacting portion 16a). Shafts 17a respectively disposed at both ends of the operating member 17 are rotatably supported by a base member 11 at both ends of each row of the contacts 16. An engagement groove 17b extending parallel with each row of the contacts 16 is formed in an inner end of each operating member 17. A pressure receiving end 17c extending in parallel relation with each row of the contacts 16 is provided on to an outer end of each operating member 17.

Each contact 16 further includes a retaining element 16c in the shape of a hook member. This retaining element 16c is provided in the vicinity of the upper end of the support base portion 16'. Preferably, the retaining element 16c projects backwardly from accommodation portion 12 from that area of the upper end of the support base portion 16' from which the projecting portion 16a projects forwardly, i.e., toward the accommodating portion 12. For being retained, this retaining element 16c is engaged in the engagement groove 17b of the operating member 17 and hooked on an acting end 17d defining the engagement groove 17b. The retaining element 16c is contact engaged with a surface (engagement surface) of this acting end 17d. As shown in FIG. 4B, when the pressure receiving end 17c of the operating member 17 is turned downwardly from a standby position shown in FIG. 4A, in order to cause the acting end 17d to turn upwardly, a tensile force is applied to the retaining element 16c while the latter is sliding on the engagement surface. As a result, as described hereinabove, the support base portion 16' is shifted backwardly so as to bring the contacting portion 16a into a position where the contacting portion 16a will not interfere with the corresponding lead.

On the contrary, each contact 16 is shifted forwardly by the restoring force of the spring portion 16b. During the forward shifting motion of the contact 16, the retaining element 16c applies a tensile force to the acting end 17d to cause the operating member 16 to turn to the standby position shown in FIG. 4A. Then, as shown in FIG. 4C, when the operating member 16 is turned generally to the end of its turning motion, the contact 16 is pressure contacted with the upper surface of the corresponding lead 13a.

A plurality of retaining element damping walls 17e are arranged, in parallel, on the surface (i.e., engagement surface with which the retaining elements 16c is engaged) of the acting end 17d and spaced at distances greater than the thickness of the respective contacts 16 such that the individual wails 17e are interposed between adjacent retaining elements 16c of the contacts. These damping walls 17e are adapted to restrain sideward displacement of the retaining elements 16c and also to guide the retaining elements 16c so that they slide vertically.

Figure 6:
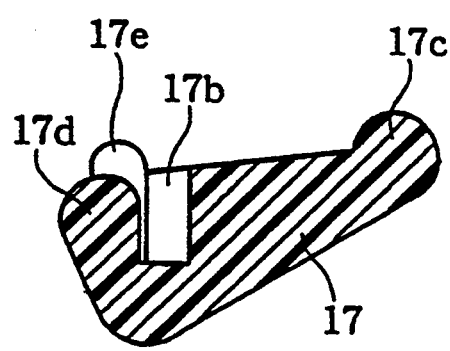
FIG. 6 is a sectional view taken on line 6—6 of FIG. 5.
Figure 7:
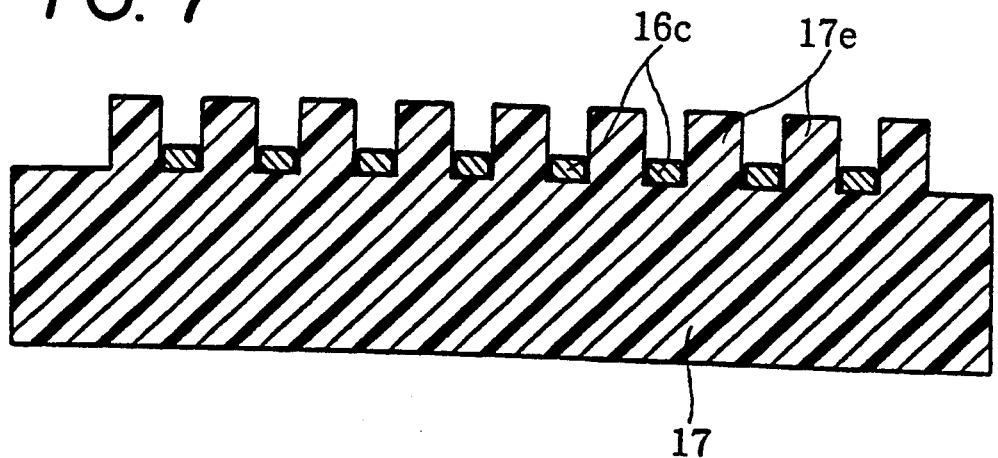
FIG. 7 is a sectional view showing a state of engagement between the operating member and the retaining elements of the contacts.
Figure 8:
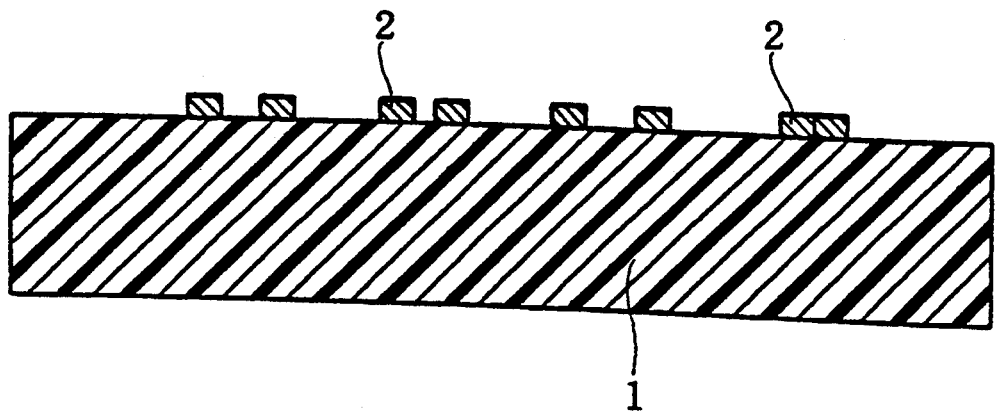
FIG. 8 is a sectional view showing a state of engagement between an operating member and retaining elements of contacts according to the prior art.

As shown in FIG. 6, the engagement surface of the acting end 17d is defined as an arcuate surface when viewed in section. The damping walls 17e are formed on this arcuate surface and interposed between adjacent retaining elements 16c. By virtue of the provision of the retaining element damping walls 17e, the retaining elements 16c are kept oriented in a normal direction during the shifting process of the contacts 16. At the same time, the retaining elements 16c are caused to slide between adjacent retaining in a vertical direction. As a consequence, each contact 16 can be shifted forwardly and backwardly while being maintained in a correct position. Therefore, each contact is effectively prevented from being horizontally displaced or being twisted. As a result, the operating member can fully carry out its function.

As described above, the cover member 18 having an opening corresponding to the accommodation portion 12 is disposed above the base member 11 such that the cover member 18 is capable of moving upwardly and downwardly relative to the base member 11. As shown in FIG. 4B, upon depression of the cover member 18, the pressure receiving end 17c of the operating member 17 is pushed down. Thereupon, the operating member is turned to cause the acting end 17d to turn upwardly, the contacts 16 are pulled laterally, and each contacting portion 16a is caused to be moved away from the corresponding lead 13a of the electric part 13.

As shown in FIG. 4C, when the depressing force on the cover 18 is removed, the contact 16 is moved forwardly by a restoring force of spring portion 16b. Owing to this restoring force, tensile force is applied to the acting end 17d of the operating member 17 so as to turn the operating member to move the pressure receiving end 17c upwardly which, in turn, pushes up the cover member 18. During the turning of the operating member 17, the retaining element damping walls 17e prevent the retaining elements 16c from moving sidewardly. Thus, harmful side displacement can be prevented, and the retaining elements 16c are guided so as to slide vertically so as to cause the corresponding leads to be contacted properly.

In a modification of the invention, instead of the turnable lever, a slider (not shown) capable of reciprocating forwardly and backwardly may be used as the operating member. In that case, the retaining elements 16c can be drawn away from surface 15 by the reciprocal motion of the slider. The pressure receiving end 17c may alternatively be turned by manual operation without using the cover member 18, Electrically insulating partition walls 14 formed on the base member 11 are interposed between adjacent contacts 16 in order to isolate the individual contacts, the contacting portions 16a of the contacts are allowed to project inwardly of the partition walls 14, and the retaining elements 16c are allowed to extend outwardly of the partition walls 14. The damping walls 17e prevent the retaining elements 16c from being displaced sidewardly, and the partition walls 14 restrain side way motion of each contact 16 in the vicinity of the contacting portion 16a, and the damping walls 17e and partition walls 14 are cooperated with each other in order to guide the contacts 16 during shifting to keep them in correct attitudes.

In the embodiments described above, the operating member 17 is engaged with the retaining elements 16c extending backwardly from the support base members 16' of the contacts 16. However, the present invention is not limited to this. For example, a part corresponding to the support base 16' may serve as the retaining element, and the operating member may be brought into engagement with this retaining element, in order to shift each contact.

As described in the foregoing, according to the present invention, the retaining element damping walls positively prevent sideward movement of the contacts while guiding vertical sliding movement of the retaining elements and properly shifting the contacts forwardly and backwardly, thereby effectively preventing harmful side displacement and twisting, thus making it possible to obviate the problems of short-circuit between adjacent contacts and irregularity of contact position attributable to side displacement and twisting. As a result, highly reliable contact relations are ensured. Therefore, the function of the operating element can be carried out effectively.

What is claimed is:

1. A socket for an electric part comprising:
   a body;
   a plurality of contacts arranged in an array on said body and adapted to be contacted with contact pieces on the electric part when the electric part is inserted into said socket;
   said contacts each having a contacting portion adapted to engage in pressure contact with a corresponding contact piece, a spring portion spaced from said contacting portion for exerting a contact pressure on said contacting portion, and a hook-shaped retaining portion spaced from said contacting portion and said spring portion; and
   an operating member outside of said spring portion and having an acting portion over which said hook-shaped retaining portions are hooked in sliding engagement with said acting portion and movably mounted on said socket body for moving said retaining portions to cause said contacting portions to be shifted away from the contact pieces of the electric part against the resilient force of said spring portions, said acting portion of said operating member having retaining element damping walls thereon spaced along said acting portion at intervals greater than the thickness of said retaining portions of said contacts and separating and guiding said retaining portions of adjacent contacts during movement of said acting portion, said operating member moving in a path for causing said acting portion to cooperate with said hook-shaped portions for holding said acting portion and said hook shaped portions in contact during movement of said acting portion and said damping walls extending away from said acting portion a distance sufficient for causing said retaining portions to remain between adjacent damping walls during all of the movement of said acting portion.

2. A contact as claimed in claim 1 in which said operating member is a lever having a pivot point intermediate the ends thereof and said acting member being constituted by one end of said lever and having an engagement surface thereon, said damping walls being on said engagement surface and said hook-shaped retaining portions engaging said engagement surface between said damping walls.

* * * * *